United States Patent
Pappas

(10) Patent No.: US 10,901,027 B2
(45) Date of Patent: Jan. 26, 2021

(54) SUBSTRATE FOR MOUNTING LIGHT EMITTING DIODES WITH TESTING CAPABILITIES

(71) Applicant: Facebook Technologies, LLC, Menlo Park, CA (US)

(72) Inventor: Ilias Pappas, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 133 days.

(21) Appl. No.: 16/008,975

(22) Filed: Jun. 14, 2018

(65) Prior Publication Data

US 2019/0018057 A1 Jan. 17, 2019

Related U.S. Application Data

(60) Provisional application No. 62/531,815, filed on Jul. 12, 2017.

(51) Int. Cl.
*G01R 31/26* (2020.01)
*G01R 1/04* (2006.01)
*G01R 1/073* (2006.01)
*G02B 27/01* (2006.01)

(52) U.S. Cl.
CPC ....... *G01R 31/2635* (2013.01); *G01R 1/0416* (2013.01); *G01R 1/07342* (2013.01); *G02B 27/017* (2013.01)

(58) Field of Classification Search
CPC ............ G01R 31/2635; G01R 1/07342; G01R 1/0416; G02B 27/017
See application file for complete search history.

(56) References Cited

U.S. PATENT DOCUMENTS

| 5,504,438 A | 4/1996 | Henley | |
|---|---|---|---|
| 2001/0020546 A1* | 9/2001 | Eldridge | B23K 20/004 174/261 |
| 2002/0163514 A1* | 11/2002 | Nagai | G09G 3/3216 345/204 |
| 2008/0204029 A1 | 8/2008 | Mihai et al. | |

(Continued)

FOREIGN PATENT DOCUMENTS

EP 1575022 A2 9/2005
WO WO 2017/037475 A1 3/2017

OTHER PUBLICATIONS

PCT International Search Report and Written Opinion, PCT Application No. PCT/US2018/041712, dated Nov. 19, 2018, 19 pages.

*Primary Examiner* — Akm Zakaria
(74) *Attorney, Agent, or Firm* — Fenwick & West LLP

(57) ABSTRACT

Embodiments relate to testing LEDs by applying a voltage difference between anode electrodes and cathode electrodes of the LEDs using transistors and probe pads and determining whether the LEDs satisfy a threshold level of operability. A final substrate has transistors that apply the voltage difference to the LEDs via conductive traces and probe pads during testing mode. A gate voltage is applied to gate terminals of the transistors, a first voltage is applied to anode electrodes of the LEDs, and a second voltage is applied to cathode electrodes of the LEDs. After applying the voltages, turning on of the LEDs is observed. Embodiments also relate to testing current leakage in the final substrate with the transistors and the LEDs.

20 Claims, 7 Drawing Sheets

(56) References Cited

U.S. PATENT DOCUMENTS

| | | | |
|---|---|---|---|
| 2011/0074429 A1 | 3/2011 | Levey et al. | |
| 2014/0152180 A1* | 6/2014 | Wolf | H05B 45/50 315/122 |
| 2014/0266217 A1* | 9/2014 | Wang | G01R 31/2635 324/414 |
| 2014/0327359 A1* | 11/2014 | Masazumi | H05B 45/44 315/122 |
| 2016/0035924 A1* | 2/2016 | Oraw | H01L 31/0508 136/244 |
| 2016/0155892 A1* | 6/2016 | Li | H01L 21/6835 257/89 |

\* cited by examiner

SUBSTRATE FOR MOUNTING LIGHT EMITTING DIODES WITH TESTING CAPABILITIES

CROSS REFERENCE TO RELATED APPLICATION

This application claims the benefit of U.S. Provisional Application No. 62/531,815, filed Jul. 12, 2017, which is incorporated by reference in its entirety.

BACKGROUND

This disclosure relates generally to semiconductor device testing, specifically to testing light emitting diodes (LEDs) using a substrate with active electronic components.

A HMD, such as for a virtual reality (VR) system, typically includes an electronic display that emits light to the eyes of the viewer, and an optical block positioned between the display and the eyes. The optical block includes optical components that receive light emitted from the electronic display, and adjust an orientation of the light such that the electronic display appears at one or more particular focal distances from user. Light emitting devices, such as micro LEDs (μLEDs) are used in electronic display panels to emit light for image production.

A conventional method of producing an electronic display panel is to fabricate LEDs on chips that are picked and placed on a substrate of the electronic display panel. Each final electronic display panel may include a large number of LEDs (e.g., 1280 LEDs for each color). If each chip contains 20 LEDs of the same color, 64 chips are picked and placed on the substrate of the electronic display panel for each color. After all of the LEDs are picked and placed on the substrate, each of the LEDs are probed individually to detect whether the LEDs on the electronic display panel turn on. However, this method of individually probing each of the LEDs on the electronic display panel (1280×3 LEDs) is costly and time consuming. Further, the connection to each LED is not tested during individual mounting of the LED onto the substrate. Instead, the substrate fully mounted with all LEDs is subject to probing and testing. This may lead to wasted LEDs because the substrate with defective LEDs is not identified until all the LEDs are mounted onto the substrate.

SUMMARY

Embodiments relate to testing LEDs by applying a voltage difference between anode electrodes and cathode electrodes of the LEDs and detecting turning on of the LEDs using transistors and probe pads. The LEDs are picked up from a first substrate and placed on a second substrate that includes transistors and probe pads. The first substrate may be a carrier substrate, and the second substrate may be a final substrate that is a part of an electronic display panel. The transistors may be used for testing connections of the LEDs to conductive components on the second substrate and may be placed in an inactive state during display operations of the final substrate following the testing.

In some embodiments, a plurality of LEDs of a same color are picked up from the first substrate and placed on the second substrate, connecting the anode electrodes and the cathode electrodes of the LEDs to conductive components on the second substrate. The second substrate is a final substrate that may be connected to a display driver circuit that is used during display operations after testing is completed. The final substrate has transistors that apply a voltage difference between the anode electrodes and the cathode electrodes of the LEDs during testing.

In some embodiments, when probe pads on the final substrate are applied with voltages, the terminals of the transistors are applied with voltages through conductive traces that connect the probe pads and the transistors. A gate voltage is applied to gate terminals of the transistors to turn the transistors on. After the transistors are on, a first voltage is applied to anode electrodes of the LEDs via one or more second probe pads, and a second voltage is applied to cathode electrodes of the LEDs via one or more third probe pads, the second voltage lower than the first voltage.

In some embodiments, when voltage difference is applied between the anode electrodes and the cathode electrodes of the LEDs, a detector is used to monitor the LEDs and to detect whether they turn on and satisfy a threshold level of operability. To simplify testing, the gate terminals of the transistors are connected together, the source terminals of the transistors are connected together, and the drain terminals of the transistors are connected together. Because the terminals of the transistors are connected together, a plurality of the LEDs may be probed at once using the probe pads instead of probing the LEDs individually.

Embodiments also relate to testing current leakage in the second substrate. A first subset of the LEDs on the final substrate may be connected to a first set of probe pads, traces, conductive components, and transistors. A second subset of the LEDs on the final substrate may be connected to a second set of probe pads, traces, conductive components, and transistors that are designed to be isolated from first subset of the LEDs. When voltage is applied to the first set of probe pads, only the first subset of LEDs that are connected to the first set of probe pads should be turned on. However, if at least a LED in the second subset of LEDs is turned on when voltage is only applied to the first set of probe pads, it indicates that there is current leakage in the second substrate.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to a method of testing LEDs on a final substrate by applying a voltage difference between anode electrodes and cathode electrodes of the LEDs via transistors and detecting turning on of the LEDs. The transistors are fabricated on the final substrate and used for testing the connections of the LEDs to conductive components on the final substrate during a testing. The transistors are placed in an inactive state during display operation times of the final substrate.

Figure 1A:
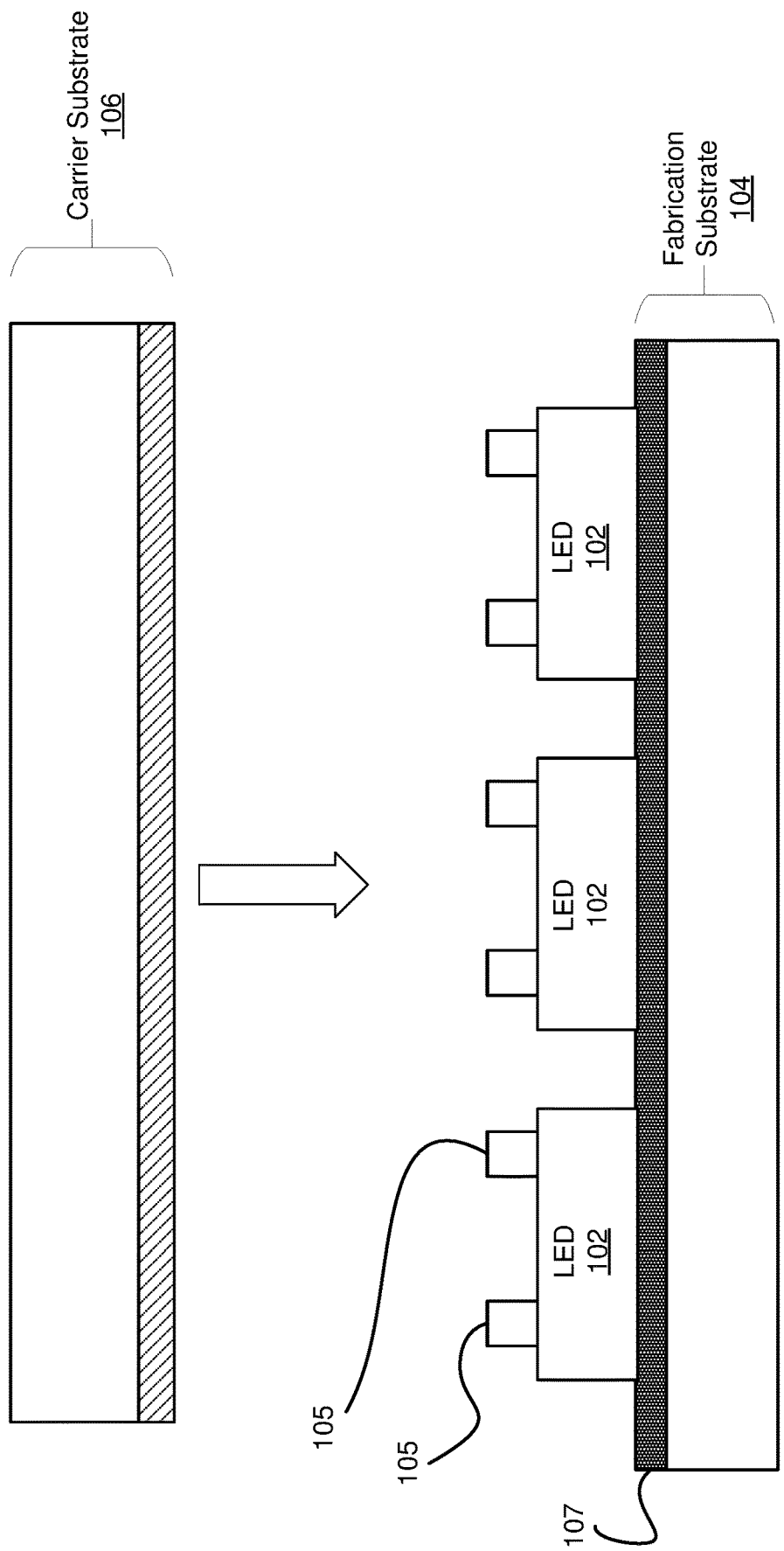
FIG. 1A illustrates a carrier substrate picking up LEDs on a fabrication substrate, in accordance with an embodiment.

FIG. 1A illustrates a carrier substrate 106 picking up LEDs 102 on a fabrication substrate 104, in accordance with an embodiment. The LEDs 102 may be fabricated by growing various layers of material on the fabrication substrate 104 using methods such as chemical vapor deposition (CVD). The LEDs 102 on the fabrication substrate are the same color, which may be red, blue, or green. The LEDs 102 may be made of gallium nitride (GaN), gallium arsenide (GaAs), or gallium phosphide (GaP), depending on the color of the LEDs 102. Each LED 102 includes electrodes 105. In one embodiment, each LED 102 includes an anode electrode and a cathode electrode. In other embodiments, LEDs in a set of LEDs 102 may each have an individual p-electrode but share an n-electrode through the body of the LED 102 or vice versa.

The carrier substrate 106 may have an adhesive layer 107 that picks up the LEDs 102 from the fabrication substrate 104. The fabrication substrate 104 is removed from the LEDs 102 once the carrier substrate 104 picks up the LEDs 102. In one embodiment, the fabrication substrate 104 may be treated with an etching medium, which separates the fabrication substrate 104 from the LEDs 102. The carrier substrate 106 provides structural support to the LEDs 102 once the fabrication substrate 104 is removed.

Figure 1B:
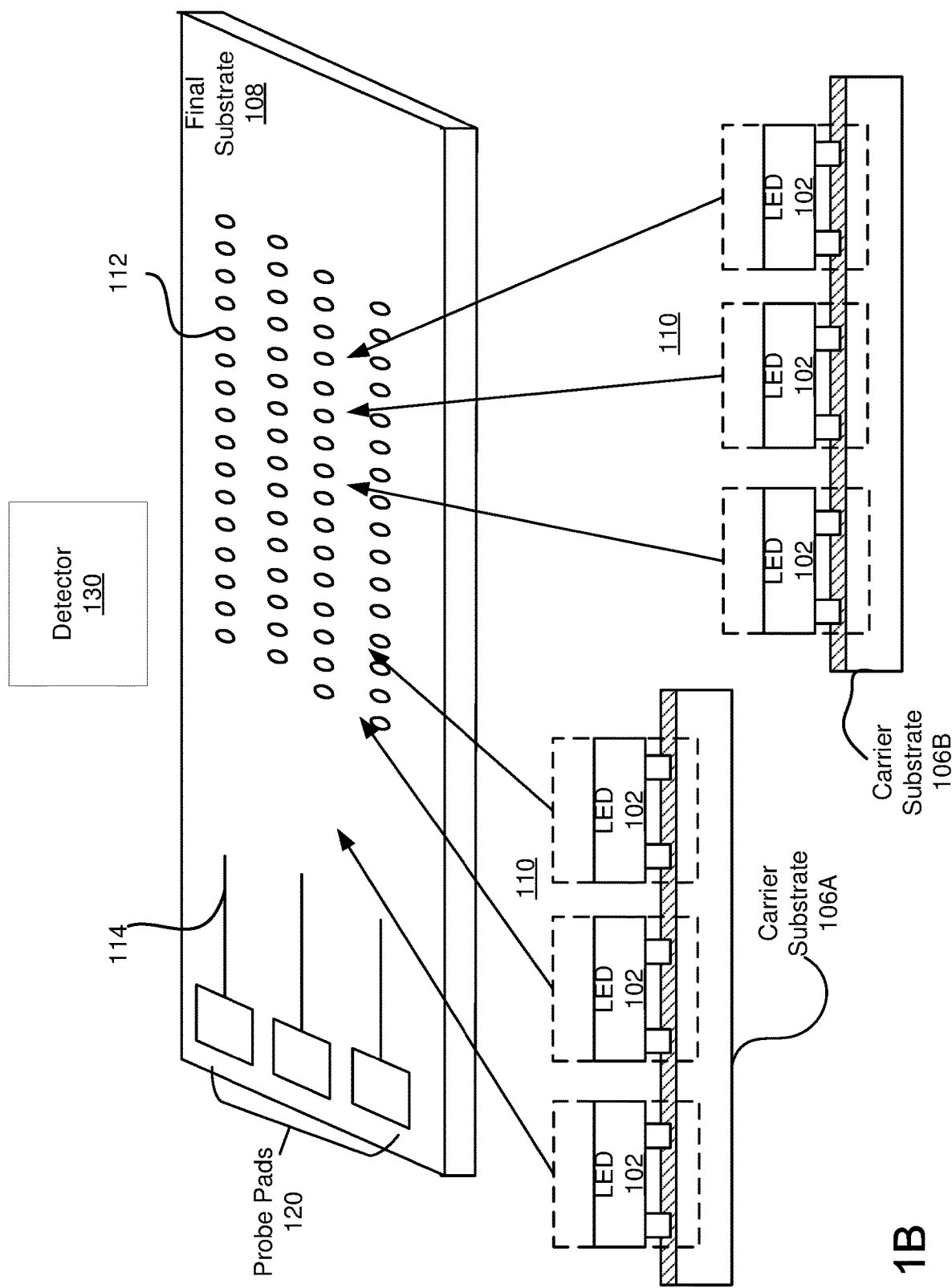
FIG. 1B illustrates the LEDs placed on a final substrate, in accordance with an embodiment.

FIG. 1B illustrates placing of the LEDs 102 on a final substrate 108, in accordance with an embodiment. Each of the carrier substrates 106A and 106B carries a plurality of LEDs 102. In one embodiment, carrier substrate 106A may carry LEDs 102 that emit a first color, and carrier substrate 106B may carry LEDs 102 that emit a second color that is different from the first color. In other embodiments, carrier substrates 106A, 106B may carry LEDs 102 that emit the same color. Although not shown in FIG. 1B, there may be additional carrier substrates with additional LEDs 102 to be placed on the final substrate 108. For example, each carrier substrate may carry a fixed number of LEDs 102 (e.g., 20 or 40 LEDs per carrier substrate). In other embodiments, there may be additional carrier substrates with LEDs 102 that are of a color different from the first and the second color.

The LEDs 102 are picked from carrier substrates 106A and 106B and placed 110 on the final substrate 108. The LEDs 102 may be attached to the carrier substrates 106A and 106B through an adhesive layer 107. In some embodiments, the LEDs 102 are removed from the adhesive layer 107 of the carrier substrates 106A and 106B with a solvent. In other embodiments, the adhesive force of the adhesive layer 107 of the carrier substrates 106A and 106B is weak enough that the LEDs 102 may be picked using force without damaging the LEDs 102.

The final substrate 108 includes probe pads 120, conductive components 112, conductive traces 114, and transistors 240. The conductive components 112 are used for conductively securing LEDs 102 to the final substrate 108 and for providing current to the LEDs 102. The conductive components 112 may be made of conductive material such as copper, copper alloys, and silver. A first subset of the conductive components 112 are connected to cathode electrodes of the LEDs 102 via a set of conductive lines (e.g., traces) 114, and a second subset of the conductive components 112 are connected to anode electrodes of the LEDs 102 via another set of conductive lines (e.g., traces) 114. In some embodiments, the electrodes may be connected to the conductive components 112 on the final substrate 108 by thermocompression (TC) bonding. The conductive components 112 are contact points between electrodes of the LEDs 102 and conductive traces 114 that extend on or in the final substrate 108. Similar to conductive components 112, the conductive traces 114 may be made of conductive material such as copper, copper alloys, and silver, and may be printed on the final substrate 108.

The probe pads 120 are conductive testing points on the final substrate 108 that are applied with voltages such that current is delivered to the conductive components 112 connected to LEDs 102 through traces 114. In some embodiments, each probe pad in a set of probe pads 120 are connected to a different terminal of transistors (e.g., gate, source, and drain). The probe pads may be made of a conductive material such as copper, copper alloys, and silver. In the example shown in FIG. 1B, there is one set of three probe pads, but in other embodiments, there may be additional probe pads 120 on the final substrate 108. The probe pads may be located anywhere on the final substrate 108.

The final substrate 108 also includes transistors (not shown) that apply a voltage difference between the anode electrodes and the cathode electrodes of the LEDs 102. The transistors may be a NPN type or a PNP type. The transistors are connected to LEDs 102 through conductive lines (e.g., traces) 114 such that when voltage is applied to probe pads 120, the transistors may turn on the LEDs 102 by applying a voltage difference to the LEDS 102. In some embodiments, there may be a transistor for each LED 102. In other embodiments, more than one LEDs 102 may be connected to one transistor. The details on operating the transistors to test the LEDs 102 are discussed in detail with respect to FIGS. 2A and 2B.

After applying voltages to the LEDs 102 via probe pads 120 and transistors, a detector 130 detects whether the LEDs 102 are turned on. The detector 130 may be a photodetector or an imaging device (e.g., camera) that uses image detection algorithms to determine which LEDs 102 on the final substrate 108 satisfy a threshold level of operability. The detector 130 may identify the position and/or the brightness of the LEDs 102 on the final substrate 108 that turn on.

Figure 2A:
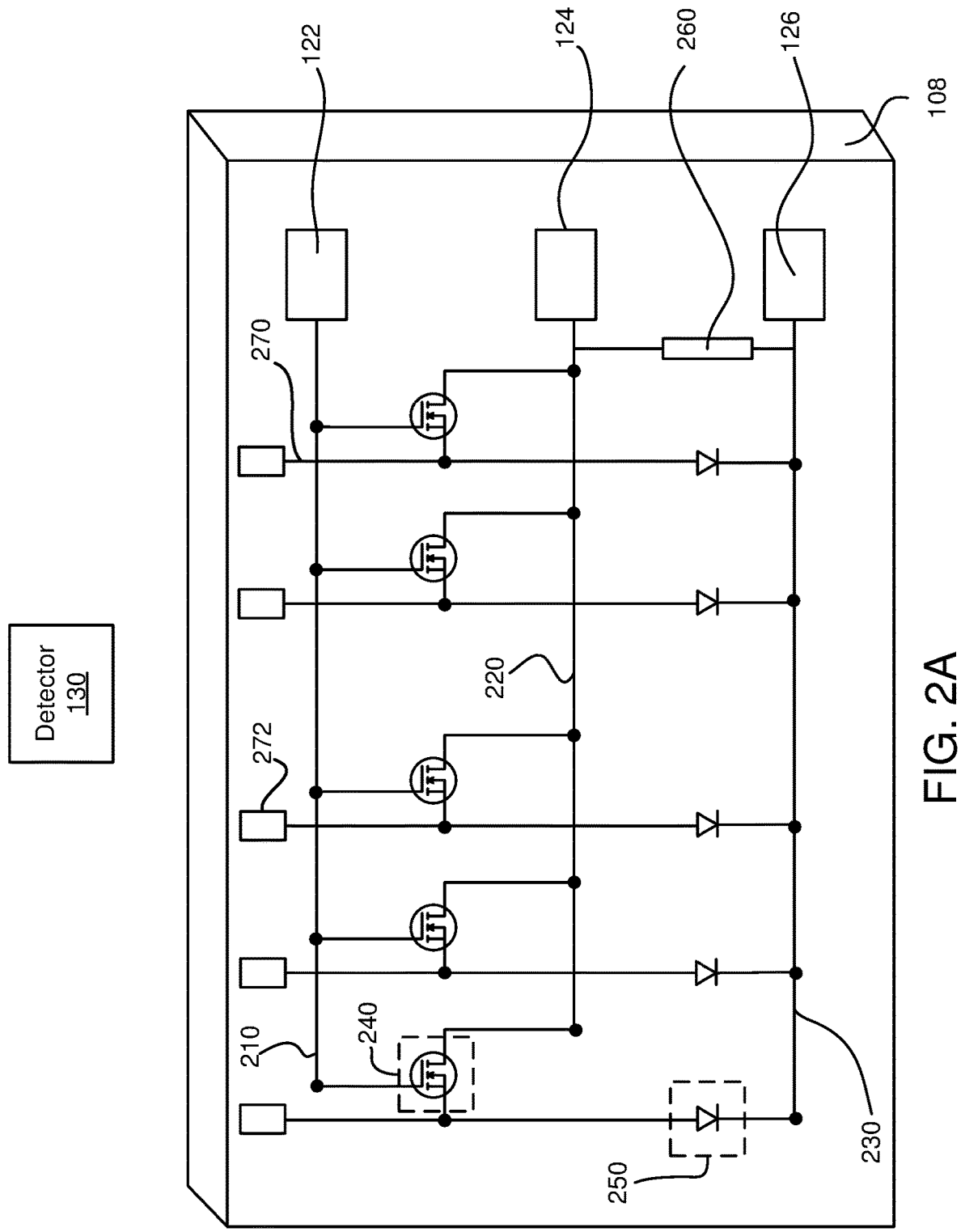
FIG. 2A is a plan view of LEDs connected to the final substrate, in accordance with an embodiment.

FIG. 2A is a plan view of LEDs 250 connected to the final substrate 108, in accordance with an embodiment. The electrodes of LEDs 250 are connected to conductive components 112 on the final substrate 108 such that a voltage difference may be applied across the LEDs 250.

The final substrate 108 has a first probe pad 122, a second probe pad 124, and a third probe pad 126. The first probe pad 122 is connected to a first conductive trace 210, which is connected to gate terminals of a plurality of transistors 240. The second probe pad 124 is connected to a second conductive trace 220 connected to drain terminals of the plurality of transistors 240. The third probe pad 126 is connected to a third conductive trace 230 connected to source terminals of the plurality of transistors 240. The gate terminals of the plurality of transistors 240 are connected together, the drain terminals of the plurality of transistors 240 are connected together, and the source terminals of the plurality of transistors 240 are connected together. In some embodiments, there is an electrostatic discharge (ESD) protection 260 between the second probe pad 124 and the third probe pad 126. The ESD protection 260 provides electrostatic discharge protection for the LEDS 250 in case of a short during testing. The ESD protection 260 is triggered when there is high current and drains the high current to prevent the LEDs 250 from being damaged. In some embodiments, the ESD protection is a resistor.

In the example shown in FIG. 2A, the plurality of transistors 240 are n-channel MOSFETs. To turn on the plurality of transistors 240, a gate voltage is applied to the first probe pad 122. The gate voltage is at or higher than a threshold voltage to create a conductive channel between the drain terminals and the source terminals of the transistors. The threshold value depends on the physical properties of the transistor. Although the example shown in FIG. 2A has n-channel MOSFETs, other types of transistors may also be used.

While the gate voltage is applied to the first probe pad 122, a first voltage is applied to the anode electrode of the LEDs 250 via the second probe pad 124, and a second voltage is applied to the cathode electrode of the LEDs 250 via the third probe pad 126, the second voltage lower than the first voltage. The second probe pad 124 is connected to drain terminals of transistors 240 through the second conductive trace 220, and the third probe pad 126 is connected to source terminals of the transistors 240 through the third conductive trace 230. The second voltage applied at the cathode electrode of the LEDs 250 is a voltage value lower (e.g., a ground voltage) than the first voltage (e.g., 5V) such that the voltage difference between the anode electrodes and the cathode electrodes of the plurality of LEDs 250 is at least a forward voltage of the LEDs 250. The forward voltage of the LEDs 250 depends on the physical properties of the LEDs 250.

When the first voltage and the second voltage are applied such that at least a forward voltage is applied across the LEDs 250, the LEDs 250 should satisfy a threshold level of operability responsive to applying the voltage difference. However, problems during the manufacturing of the LEDs 250 and during picking and placing of the LEDs 250 on the final substrate 108 may cause a defect in the LEDs 250. In some cases, at least one LEDs 250 may not turn on when a voltage difference is applied between the electrodes of the LEDs 250. In some cases, at least one LEDs 250 may turn on but the light emission may be too dim or may flicker. A detector 130 may be used to determine the number of LEDs 250 that do not satisfy the threshold level of operability and locations of these LEDs 250. If the number of LEDs 250 that do not satisfy the threshold level of operability is below a threshold, the locations of these LEDs 250 may be saved. During display mode, the locations of these LEDs 250 may be used to compensate for the defective LEDs 250. For example, display data sent to LEDs 250 that surround the defective LEDs 250 may be adjusted to compensate for the defective LEDs 250 that do not satisfy a threshold level of operability. In some embodiments, the final substrate 108 may be discarded when the number of LEDs 250 that do not satisfy a threshold level of operability is above the threshold.

In some embodiments, the LEDs 250 are tested in increments. For example, a first set of LEDs 250 from one carrier substrate may be picked and placed onto the final substrate 108. The first set of LEDs 250 are tested with a voltage difference via transistors 240 and responsive to determining that the first set of LEDs 250 satisfy a threshold level of operability, LEDs 250 from a second set of LEDs 250 from a second carrier substrate may then be picked and placed onto the final substrate. By testing the LEDs 250 in increments and connecting additional LEDs 250 only when all of the previously tested LEDs 250 satisfy a threshold level of operability, fewer LEDs 250 may be discarded if testing fails.

The probe pads 122, 124, and 126 are only used in the testing operation of the final substrate 108. During display mode, the LEDs 250 are placed in an inactive state and are not turned on. Instead, one of the electrodes of each LEDs 250 is directly connected to a voltage source such as a display driver through a fourth trace 270. In some embodiments, there are conductive components 272 on the final substrate 108 that are used as connection points between the fourth trace 270 and the display driver.

In the example shown in FIG. 2A, there is only one row of LEDs 250. However, in other examples, there may be additional rows of LEDs 250. In some embodiments, each row of LEDs 250 may correspond to a color (e.g., red, green, or blue), and the rows may be arranged so that the combination of the color may be used to create an image on the final substrate 108 using the LEDs 250. In other embodiments, each row may have LEDs 250 of different colors.

Figure 2B:
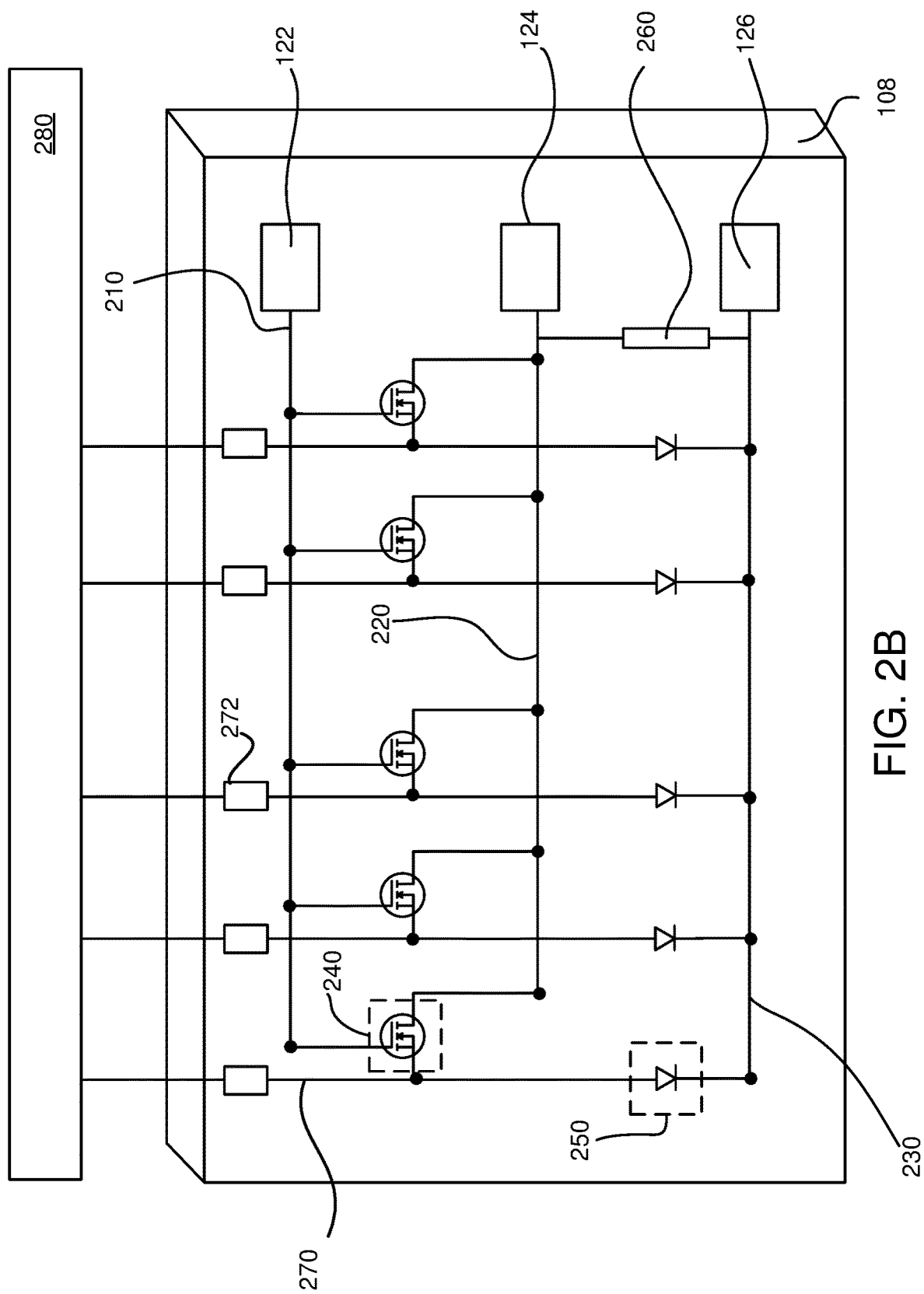
FIG. 2B is a plan view of the final substrate connected to a display driver, in accordance with an embodiment.

FIG. 2B is a plan view of the final substrate 108 connected to a display driver 280, in accordance with an embodiment. After LEDs 250 have been tested, the final substrate may operate in a display mode. During the display mode, the LEDs 250 on the final substrate 108 are applied with voltage signals from display driver 280 that is connected to the LEDs 250 through the fourth traces 270. The fourth traces 270 may be connected to the display driver 280 through conductive components 272. The conductive components 272 may be made of materials such as copper, copper alloys, and silver. The conductive components 272 allow current to travel from the display driver 280 to the LEDs 250. The display driver 280 may be an integrated circuit which receives driving instructions to display images using the LEDs 250 on the final substrate 108. In some embodiments, the display driver 280 may have a plurality of output pins such that each output pin is connected to a LED 250 through the fourth trace 270. In some embodiments, the display driver 280 is mounted on the final substrate 108 with the LEDs 250. In other embodiments, the display driver 280 is mounted on a different substrate and then connected to the final substrate 108 via a flexible printed circuit board (FPCB).

The anode electrodes of the LEDs 250 are connected to the output pins of the display drive 280. Although the anode electrode of the LEDs 250 are also connected to the source terminals of the transistors 240, the transistors are not active during display mode. When the voltage output of the display drive 280 at the pin that a LED 250 is connected to is at least a forward voltage, the LED 250 turns on. In the example shown in FIG. 2B, there is a one-to-one relationship between the output pins and the LEDs 250. However, in some embodiments, multiple LEDs 250 may be controlled by one output pin of the display driver 280.

In some embodiments, the final substrate 108 and display driver 280 are a part of a display system in a near-eye device (NED) that may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 3:
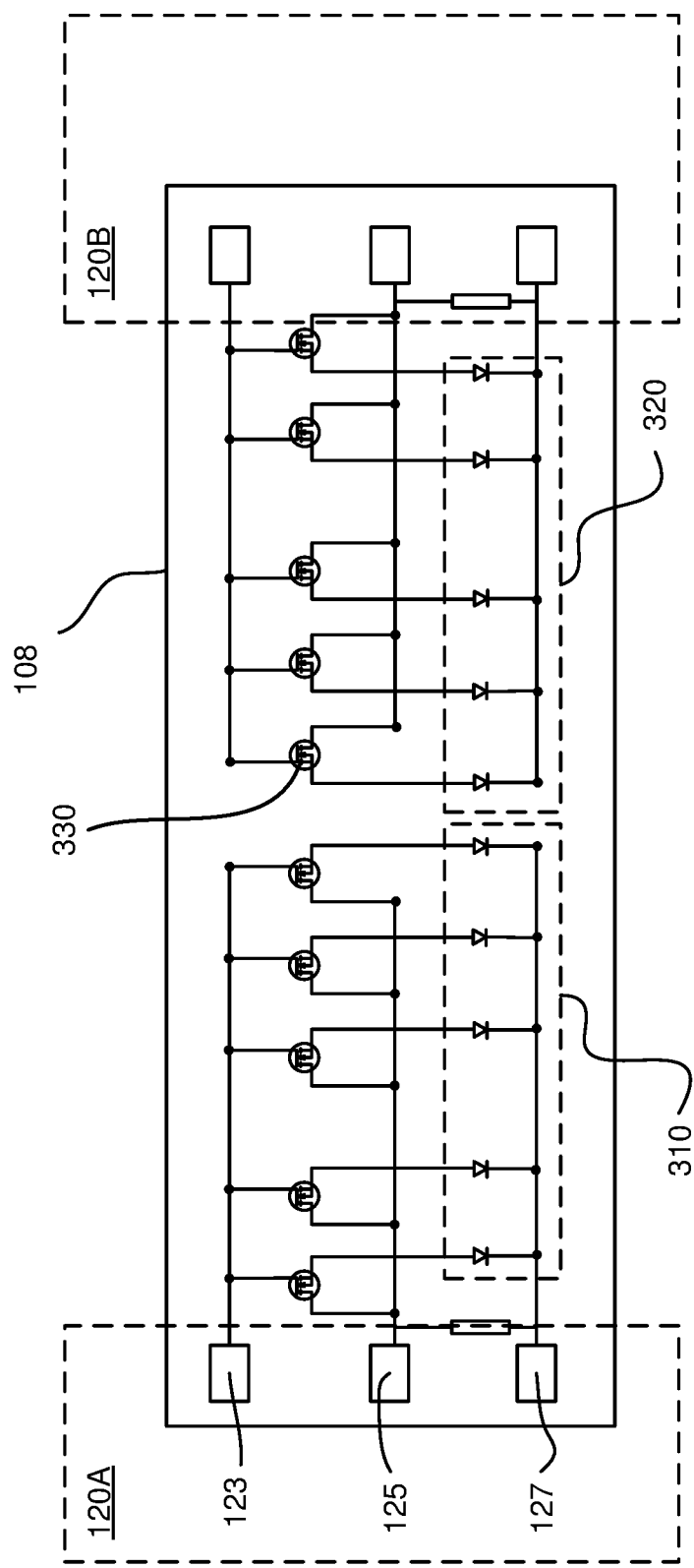
FIG. 3 is a plan view of the final substrate with two sets of probe pads, in accordance with an embodiment.

FIG. 3 is a plan view of the final substrate 108 with two sets of probe pads, in accordance with an embodiment. In the example shown in FIG. 3, there is a first set of probe pads 120A and a second set of probe pads 120B on the final substrate 108. The first set of probe pads 120A is connected to a first set of LEDs 310 and the second set of probe pads 120B is connected to a second set of LEDs 320. The first set of probe pads 120A is connected to the first set of LEDs 310 through conductive traces, which is isolated from the second set of probe pads 120B or conductive traces connected to the second set of probe pads 120B. Because the first set of probe pads and the second set of probe pads are designed to be isolated, current should not flow between the two sets.

In one embodiment, test voltages are applied to the first set of probe pads 120A to apply a voltage difference between anode electrodes and cathode electrodes of the first set of LEDs 310. A first probe pad 123 of the first set of probe pads 120A is connected to gate terminals of a first set of transistors 330. A second probe pad 125 of the first set of probe pads 120A is connected to drain terminals of the first set of transistors 330. A third probe pad 127 of the first set of probe pads 120A is connected to source terminals of the first set of transistors 330. The gate terminals of the first set of transistors 330 are connected together, the drain terminals of the first set of transistors 330 are connected together, and the source terminals of the first set of transistors 330 are connected together. In the example shown in FIG. 3, the first probe pad 123 of the first set of probe pads 120A is applied with a gate voltage to turn on the first set of transistors 330. A first voltage is applied to the anode electrode of the LEDs 310 via the second probe pad 125, and a second voltage is applied to the cathode electrode of the LEDs 310 via the third probe pad 127, the second voltage lower than the first voltage. When the voltage difference across the first set of LEDs 310 is greater than a forward voltage of the LEDs 310, the first set of LEDs 310 turn on.

Because there is no contact between the first set of probe pads 120A and the second set of probe pads 120B, there should not be any LEDs from the second set of LEDs 320 that turn on when voltages are not applied to the second set of probe pads 120B. However, in some embodiments, there is current leakage in the final substrate 108 that causes one or more LEDs from the second set of LEDs 320 to turn on when voltage is applied to the first set of probe pads 120A. When current leakage in the final substrate 108 is detected, the final substrate 108 may be discarded or a remedial action is taken on the final substrate 108.

Figure 4:
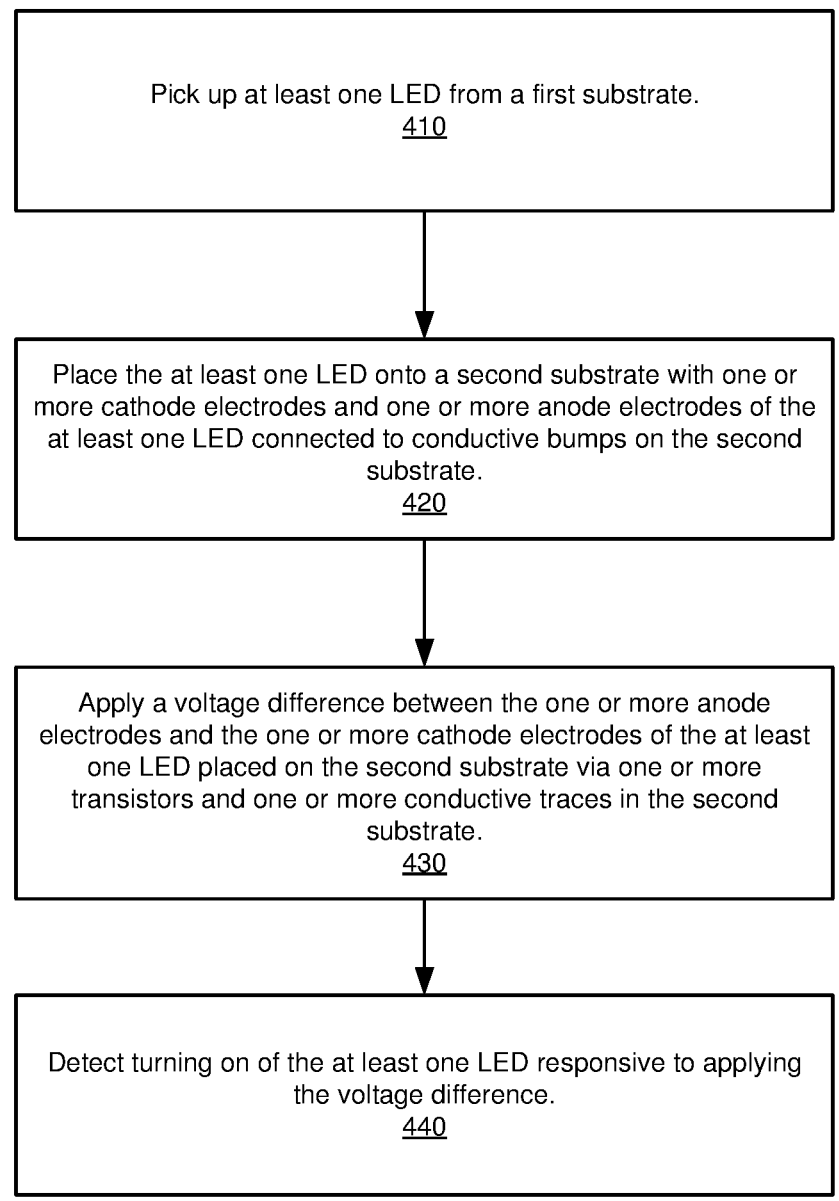
FIG. 4 is a flowchart illustrating the process of testing LEDs, in accordance with an embodiment.

FIG. 4 is a flowchart illustrating the process of testing LEDs, in accordance with an embodiment. At least one LED is picked up 410 from a first substrate, which may be a carrier substrate. The at least one LED is placed 420 onto a second substrate with one or more cathode electrodes and one or more anode electrodes of the at least one LED connected to conductive components on the second substrate. The conductive components are contact points between the electrodes of the at least one LED and conductive traces through which current flows on the second substrate.

A voltage difference is applied 430 between the one or more anode electrodes and the one or more cathode electrodes of the at least one LED placed on the second substrate via one or more transistors and one or more conductive traces in the second substrate. A gate voltage may be applied to one or more first probe pads on the second substrate to turn on the one or more transistors. When the one or more transistors are turned on, a voltage difference is applied between the anode electrodes and cathode electrodes of the at least one LED. A first voltage is applied to one or more anode electrodes of the at least one LED via one or more second probe pads that are connected to the transistors. The second probe pads may be connected to drain terminals of the one or more transistors. A second voltage that is lower than the first voltage is applied to one or more cathode electrodes of the at least one LED via one or more third probe pads.

The at least one LED is observed to detect 440 turning on of the at least one LED responsive to applying the voltage difference. When the voltage difference between the anode electrode and the cathode electrode is at least a forward voltage of the at least one LED, the at least one LED should satisfy a threshold level of operability. If the at least one LED does not satisfy a threshold level of operability, the second substrate may be discarded because it is defective.

Figure 5:
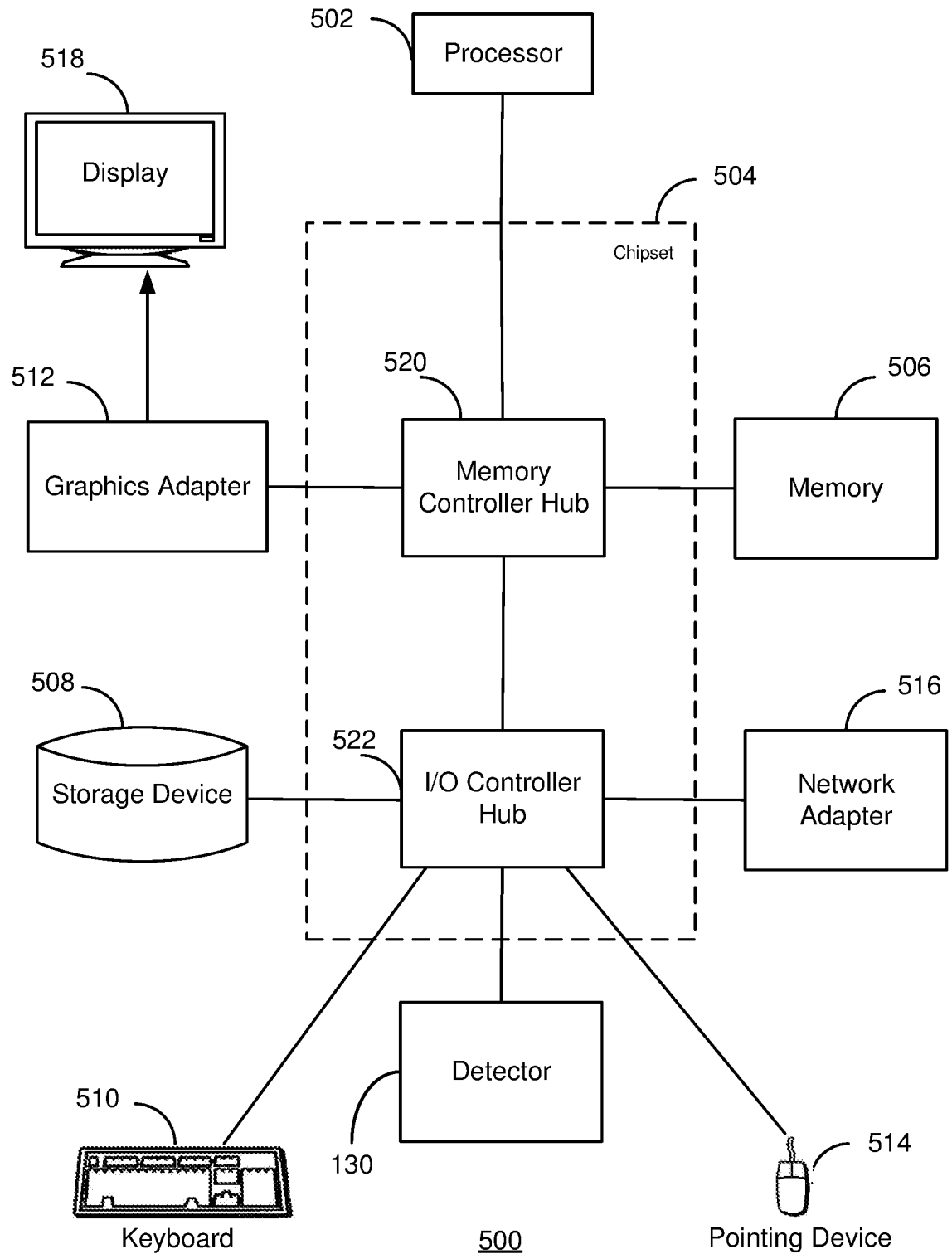
FIG. 5 is a block diagram illustrating a computing system for use in the LEDs testing system, in accordance with an embodiment.

FIG. 5 is a block diagram illustrating detector 130 that is embodied using a computer system for use in the LEDs testing system, in accordance with an embodiment. The computer system 500 may be used to control the testing processes or manufacturing processes discussed herein. For example, the method 400 shown in FIG. 4 may be performed under the control of the computing system 500. Illustrated in FIG. 5 are at least one processor 502 coupled to a chipset 504. The chipset 504 includes a memory controller hub 520 and an input/output (I/O) controller hub 522. A memory 506 and a graphics adapter 512 are coupled to the memory controller hub 520, and a display device 518 is coupled to the graphics adapter 512. A detector 130, storage device 508, keyboard 510, pointing device 514, and network adapter 516 are coupled to the I/O controller hub 522. Other embodiments of the computer 500 have different architectures. For example, the memory 506 is directly coupled to the processor 502 in some embodiments.

The storage device 508 includes one or more non-transitory computer-readable storage media such as a hard drive, compact disk read-only memory (CD-ROM), DVD, or a solid-state memory device. The memory 506 holds instructions and data used by the processor 502. For example, the memory 506 may store instructions that when executed by the processor 502, configures the processor to perform the method 400. The pointing device 514 is used in combination with the keyboard 510 to input data into the computer system 500. The graphics adapter 512 displays images and other information on the display device 518. In some embodiments, the display device 518 includes a touch screen capability for receiving user input and selections. The network adapter 516 couples the computer system 500 to a network that controls, for example, for operating probes and a movement mechanism for discarding defective final substrates. Some embodiments of the computer 500 have different and/or other components than those shown in FIG. 5.

The computer 500 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 508, loaded into the memory 506, and executed by the processor 502. For example, program instructions for the method describe herein can be stored on the storage device 508, loaded into the memory 506, and executed by the processor 502.

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
    picking up one or more light emitting diodes (LEDs) from a first substrate;
    placing the one or more LEDs onto a second substrate with one or more cathode electrodes and one or more anode electrodes of the one or more LEDs connected to conductive components on the second substrate, wherein the second substrate is a final substrate configured to be connected to a display driver circuit for displaying images using the one or more LEDs;
    applying a voltage difference between the one or more anode electrodes and the one or more cathode electrodes of the one or more LEDs placed on the second substrate via one or more transistors and one or more conductive traces in the second substrate; and
    determining whether the one or more LEDs satisfies a threshold level of operability responsive to applying the voltage difference.

2. The method of claim 1, wherein applying the voltage difference comprises:
    applying a gate voltage to one or more first probe pads on the second substrate to turn on the one or more transistors;
    applying a first voltage to the one or more anode electrodes of the one or more LEDs via one or more second probe pads on the second substrate and the one or more transistors; and
    applying a second voltage to the one or more cathode electrodes of the one or more LEDs via one or more third probe pads on the second substrate, the second voltage lower than the first voltage.

3. The method of claim 2, wherein the applied gate voltage is at least a threshold voltage of the one or more transistors.

4. The method of claim 2, wherein the first substrate is a carrier substrate mounted with LEDs emitting light of a same color, and an output voltage from the display driver circuit is provided to a conductive trace on the second substrate providing the first voltage to the one or more anode electrodes of the one or more LEDs.

5. The method of claim 2, further comprising detecting current leakage in the second substrate by:
    applying the voltage difference to one set of probe pads among a plurality of sets of probe pads, and
    detecting turning on of one or more LEDs that are designed to be isolated from the one set of the probe pads.

6. The method of claim 1, wherein placing the one or more LEDs onto the second substrate comprises bonding the one or more anode electrodes of the one or more LEDs and the one or more cathode electrodes of the one or more LEDs to the conductive components on the second substrate by thermocompression bonding.

7. The method of claim 5, further comprising discarding the second substrate responsive to detecting that the one or more LEDs is not turned on responsive to applying the voltage difference.

8. The method of claim 1, wherein gate terminals of at least a subset of the one or more transistors are connected together, source terminals of the at least the subset of the one or more transistors are connected together, and drain terminals of the at least the subset of the one or more transistors are connected together.

9. The method of claim 1 further comprising:
    responsive to determining that the one or more LEDs satisfies the threshold level of operability, picking up an additional LED from the first substrate; and
    placing the additional LED onto the second substrate with a cathode electrode and an anode electrode of the additional LED connected to the conductive components on the second substrate.

10. A substrate for mounting a plurality of light emitting diodes (LEDs), comprising:
    first conductive components configured to connect with cathode electrodes of the plurality of LEDs;
    second conductive components configured to connect with anode electrodes of the plurality of LEDs; and
    transistors on the substrate during a testing operation to determine connection of one or more of the plurality of LEDs, the transistors configured to apply a voltage difference between the cathode electrodes via the first conductive components and the anode electrodes via the second conductive components,
    wherein the substrate is configured to be connected to a display driver circuit for displaying images using the plurality of LEDs.

11. The substrate of claim 10, wherein the transistors are placed in an inactive state after the plurality of LEDs are connected to the display driver circuit.

12. The substrate of claim 10, further comprising:
    one or more first probe pads on the substrate configured to receive a gate voltage to turn on the transistors;
    one or more second probe pads on the substrate configured to receive a first voltage to apply to the anode electrodes via the transistors; and
    one or more third probe pads on the substrate configured to receive a second voltage to apply to the cathode electrodes, the second voltage lower than the first voltage.

13. The substrate of claim 12, wherein the received gate voltage is at least a threshold voltage of the transistors.

14. The substrate of claim 12, further comprising a conductive trace providing the first voltage from the one or more second probe pads to the one or more anode electrodes of at least one LED.

15. The substrate of claim 12, wherein one of the first probe pads is coupled to gates of a first set of the transistors, another of the first probe pads is coupled to gates of a second set of transistors, one of the second probe pads is coupled to anode electrodes of the first set of transistors, and another of the second probe pads is coupled to cathode electrodes of the second set of transistor.

16. The substrate of claim 10, wherein the substrate is discarded responsive to detecting that the at least one of the plurality of the LEDs is not turned on responsive to applying the voltage difference.

17. The substrate of claim 10, wherein gate terminals of at least a subset of the transistors are connected together, source terminals of at least the subset of the transistors are connected together, and drain terminals of at least the subset of the transistors are connected together.

18. A non-transitory computer readable medium storing instructions that when executed by a processor of a display manufacturing system cause the processor to:

pick up one or more light emitting diodes (LEDs) from a first substrate;

place the one or more LEDs onto a second substrate with one or more cathode electrodes and one or more anode electrodes of the one or more LEDs connected to conductive components on the second substrate, wherein the second substrate is a final substrate configured to be connected to a display driver circuit for displaying images using the one or more LEDs;

apply a voltage difference between the one or more anode electrodes and the one or more cathode electrodes of the one or more LEDs placed on the second substrate via one or more transistors and one or more conductive traces in the second substrate; and determine whether the one or more LEDs satisfies a threshold level of operability responsive to applying the voltage difference.

19. The computer readable medium of claim 18, further storing instruction that cause the processor to:

apply a gate voltage to one or more first probe pads on the second substrate to turn on the one or more transistors;

apply a first voltage to the one or more anode electrodes of the one or more LEDs via one or more second probe pads on the second substrate and the one or more transistors; and apply a second voltage to the one or more cathode electrodes of the one or more LEDs via one or more third probe pads on the second substrate, the second voltage lower than the first voltage.

20. The computer readable medium of claim 18, further storing instructions that cause the processor to:

apply a gate voltage to a first subset of the one or more transistors via a first probe pad at a first time;

apply the gate voltage to a second subset of the one or more transistors via a second probe pad at a second time different from the first time;

detect turning on of the one or more transistors to determine current leakage in the second substrate.

* * * * *

UNITED STATES PATENT AND TRADEMARK OFFICE
CERTIFICATE OF CORRECTION

PATENT NO. : 10,901,027 B2  
APPLICATION NO. : 16/008975  
DATED : January 26, 2021  
INVENTOR(S) : Ilias Pappas Page 1 of 1

It is certified that error appears in the above-identified patent and that said Letters Patent is hereby corrected as shown below:

In the Claims

In Column 10, in Claim 9, Line 18, after "claim 1" insert -- , --.

In Column 10, in Claim 15, Line 67, delete "transistor." and insert -- transistors. --, therefor.

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*